(12) United States Patent
Okumura et al.

(10) Patent No.: US 7,470,998 B2
(45) Date of Patent: Dec. 30, 2008

(54) SEMICONDUCTOR DEVICE AND METHOD OF MANUFACTURING THE SAME

(75) Inventors: Katsuya Okumura, Tokyo-To (JP); Koji Maruyama, Nirasaki (JP); Kazuya Nagaseki, Nirasaki (JP); Akiteru Rai, Nara (JP)

(73) Assignees: Octec Inc., Tokyo-To (JP); Tokyo Electron Limited, Tokyo-To (JP); Sharp Kabushiki Kaisha, Osaka-Fu (JP); Ibiden Co., Ltd., Gifu-ken (JP)

( * ) Notice: Subject to any disclaimer, the term of this patent is extended or adjusted under 35 U.S.C. 154(b) by 124 days.

(21) Appl. No.: 11/373,154

(22) Filed: Mar. 13, 2006

(65) Prior Publication Data

US 2006/0154473 A1    Jul. 13, 2006

Related U.S. Application Data

(62) Division of application No. 10/855,889, filed on May 28, 2004, now Pat. No. 7,084,005.

(30) Foreign Application Priority Data

May 28, 2003   (JP)   ............................. 2003-151405
Apr. 19, 2004  (JP)   ............................. 2004-122691

(51) Int. Cl.
  *H01L 23/84*   (2006.01)
  *H01L 23/52*   (2006.01)
  *H01L 29/40*   (2006.01)

(52) U.S. Cl. ....................... 257/784; 257/678; 257/701; 257/E21.17; 257/E21.218; 257/E21.304; 257/E21.508; 257/E21.511

(58) Field of Classification Search ................. 257/784, 257/678, 734, 701, 737, 780, 781, 782, 783
See application file for complete search history.

(56) References Cited

U.S. PATENT DOCUMENTS

| 5,646,446 | A   |    | 7/1997  | Nicewarner et al. | 257/723 |
|-----------|-----|----|---------|-------------------|---------|
| 6,392,143 | B1  |    | 5/2002  | Koshio            | 174/52.4 |
| 6,479,888 | B1  | *  | 11/2002 | Hirashima et al.  | 257/673 |
| 6,573,119 | B1  | *  | 6/2003  | Hirashima et al.  | 438/64  |
| 6,812,554 | B2  | *  | 11/2004 | Hirashima et al.  | 257/673 |
| 7,226,815 | B2  | *  | 6/2007  | Takahashi         | 438/106 |

* cited by examiner

*Primary Examiner*—David Nhu
(74) *Attorney, Agent, or Firm*—Smith, Gambrell & Russell, LLP

(57) ABSTRACT

The present invention relates to a semiconductor device in which an electrode of a device formed on a substrate such as a semiconductor wafer and an electrode of a wiring structure such as an interposer are connected to each other through a connecting electrode extending through the substrate, and a method of manufacturing the same. A semiconductor device according to the present invention comprises a first substrate including a front surface and a back surface, a first device having a first electrode being formed on the front surface; and a wiring structure formed with a second electrode, the wiring structure having a principal surface. The first electrode of the first device and the second electrode of the wiring structure are connected to each other by a connecting electrode extending through the first substrate from the front surface to the back surface thereof. Substantially all the back surface of the first substrate is bonded to the principal surface of the wiring structure. A dielectric film formed between the first substrate and the wiring structure may be an adhesive layer.

7 Claims, 8 Drawing Sheets

SEMICONDUCTOR DEVICE AND METHOD OF MANUFACTURING THE SAME

CROSS REFERENCE TO RELATED APPLICATION

This application is a division of Ser. No. 10/855,889, filed May 28, 2004 now U.S. Pat. No. 7,084,005, which is being incorporated in its entirety herein by reference.

BACKGROUND OF THE INVENTION

1. Field of the Invention

The present invention relates to a semiconductor device in which an electrode of a device formed on a substrate such as a semiconductor wafer and an electrode of a wiring structure such as an interposer are connected to each other through a connecting electrode extending through the substrate, and a method of manufacturing the same.

2. Background Art

In the field of semiconductor device packaging, higher density packaging for semiconductor devices has been in demand, because of a recent need for storing a larger volume of information. With a view to reducing a packaging size, various laminated packaging methods have been developed. Drawing of wirings from a silicon chip, in which a semiconductor circuit is formed, to a device package has been conventionally carried out by means of fine metal wirings. In such an art, the following method is proposed to eliminate a wiring area (for example, Japanese Patent Laid-Open Publication No. 2001-53218; and proceedings of 2001 International Conference on Electronics Packaging, pages 39 to 43).

First, a hole (through-hole) extending through a silicon chip is formed in a signal output electrode part on the silicon chip. Then, the through-hole is filled with a metal material (Al, Cu, and so on) so that an electrode exposed to a lower surface of the silicon chip is formed. Next, an interposer (converter) of approximately the same size as that of the silicon chip is prepared. The electrode on the lower surface of the silicon chip and a signal output electrode of the interposer are connected to each other by a soldered bump. Then, an electrode array on the silicon chip is converted into an electrode array for packaging, and the silicon chip is packaged. When another silicon chip is additionally laminated on the silicon chip, the same method is employed.

However, when a silicon chip and an interposer are connected by a soldered bump, or when silicon chips are connected by a soldered bump, a gap is formed therebetween equal to a thickness of the soldered bump. Thus, a laminated thickness is increased and a reduction of a packaging size cannot be sufficiently achieved. In addition, such a gap deteriorates a heat dissipation of the chip.

SUMMARY OF THE INVENTION

The present is made in view of the above disadvantages. An object of the present invention is to provide a semiconductor device in which a packaging size can further be reduced while a heat dissipation can be enhanced, and a method of manufacturing the same.

In order to achieve the object, according to the present invention, there is provided a semiconductor device comprising: a first substrate including a front surface and a back surface, a first device having a first electrode being formed on the front surface; a wiring structure formed with a second electrode, the wiring structure having a principal surface; and a connecting electrode extending through the first substrate from the front surface to the back surface thereof, and connecting the first electrode of the first device and the second electrode of the wiring structure, wherein substantially all the back surface of the first substrate is bonded to the principal surface of the wiring structure.

Since substantially all the back surface of the first substrate is bonded to the principal surface of the wiring structure, a gap between the substrate and the wiring structure, which is formed when a soldered bump is used, can be eliminated. Thus, a thickness in a laminating direction of the semiconductor device can be reduced by a thickness of the gap. As a result, a packaging size of the semiconductor device can be downscaled, and a heat dissipation thereof can be improved.

In the semiconductor device, It is preferable that a dielectric film is formed between the first substrate and the wiring structure. In this case, the first substrate and the wiring structure may be bonded to each other by forming the dielectric film as an adhesive layer.

According to the present invention, there is also provided a method of manufacturing a semiconductor device comprising the steps of: preparing a first substrate having a front surface and a back surface, a first device having a first electrode being formed on the front surface; preparing a wiring structure formed with a second electrode, the wiring structure having a principal surface; bonding the principal surface of the wiring structure to substantially all the back surface of the first substrate through an adhesive film therebetween; forming a through-hole extending from the front surface of the first substrate to the second electrode of the wiring structure; and filling the through-hole with metal to form a connecting electrode connecting the first electrode of the first device and the second electrode of the wiring structure.

In this way, after the principal surface of the wiring structure is bonded to substantially all the back surface of the first substrate through the dielectric film, the connecting electrode extending through from the front surface of the first substrate to the second electrode of the wiring structure is formed. Therefore, a laminated structure of the first substrate and the wiring structure can be formed without generating a gap caused by a soldered bump. Accordingly, it is possible to manufacture a semiconductor device in which a packaging size is further reduced and a heat dissipation is enhanced. After the first substrate and the wiring structure are bonded to each other through the dielectric film, the through-hole extending from the front surface of the first substrate to the second electrode of the wiring structure is formed, and then the through-hole is filled with a metal to form the connecting electrode. Consequently, it is possible to manufacture a semiconductor device having a high reliability of withstand voltage at a periphery of the through-hole.

Also in this manufacturing method, the first substrate and the wiring structure may be bonded to each other by forming the dielectric film as an adhesive layer.

According to the present invention, there is also provided a method of manufacturing a semiconductor device comprising the steps of: preparing a first substrate having a front surface and a back surface, a first device having a first electrode being formed on the front surface; preparing a wiring structure formed with a second electrode, the wiring structure having a principal surface; forming a through-hole in the first substrate extending from the front surface to the back surface thereof; forming a dielectric film substantially all over the back surface of the first substrate formed with the through-hole; bonding the principal surface of the wiring structure to the back surface of the first substrate through the dielectric film; and filling the through-hole with metal to form a connecting electrode connecting the first electrode of the first device and the second electrode of the wiring structure.

In this way, the dielectric film is formed substantially over all the back surface of the first substrate formed with the through-hole, and then the principal surface of the wiring structure is bonded to the back surface of the first substrate through the dielectric film. Thereafter, the through-hole is filled with a metal to form the connecting electrode. Therefore, a laminated structure of the first substrate and the wiring structure can be formed without forming a gap caused by a soldered bump. Accordingly, it is possible to manufacture a semiconductor device in which a packaging size is further reduced and a heat dissipation is enhanced. The manufacturing steps can be simplified compared with the above method in which the through-hole is formed after the first substrate and the wiring structure are bonded to each other.

In the manufacturing method according to the present invention, the step of forming the connecting electrode may include a step of applying voltage to the first electrode of the wiring structure to electro-plate the same. The step of forming the connecting electrode may include the sub-steps of: forming a metal layer in the through-hole; and applying voltage to the metal layer to electro-plate the same.

In the semiconductor device and the method of manufacturing the same according to the present invention, the wiring structure may be either an interposer or a second substrate formed with a second device having a second electrode. The first substrate may be either a semiconductor wafer or a semiconductor chip.

As described above, a semiconductor device according to the present invention, or a semiconductor device manufactured by a method according to the present invention, needs no soldered bump. Thus, a further miniaturization of a packaging size can be attained, and a packaging with an increased density can be realized which allows for storing a larger volume of information. At the same time, a heat dissipation of the semiconductor device can be enhanced.

BRIEF DESCRIPTION OF THE DRAWINGS

FIG. 1b is a perspective view of the assembled semiconductor device shown in FIG. 1a;

DETAILED DESCRIPTION OF THE INVENTION

Embodiments of the present invention will be described below with reference to the drawings.

Figure 1A:
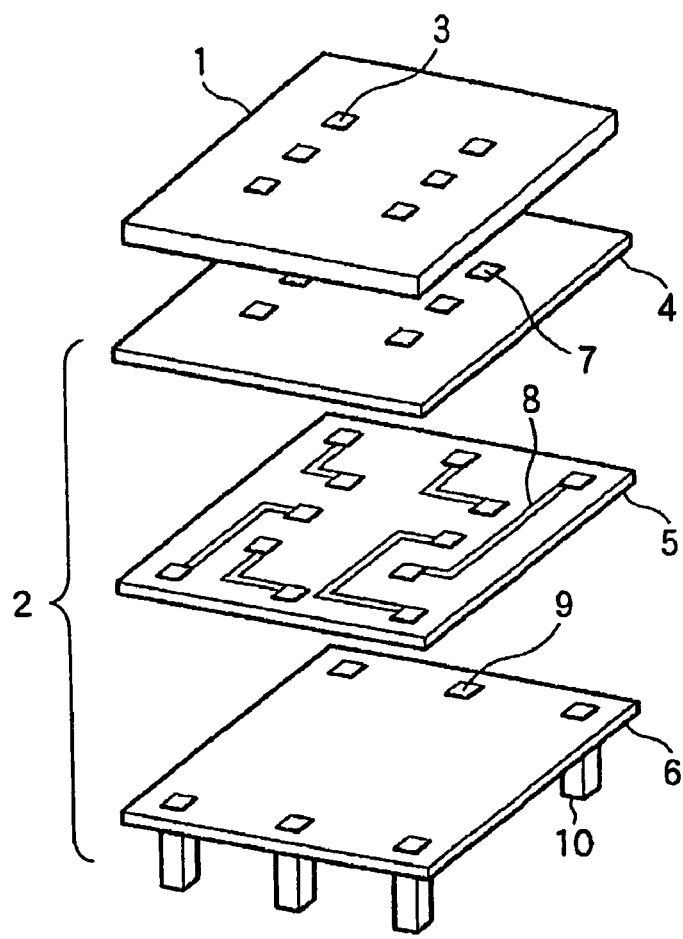
FIG. 1a is a perspective exploded view showing an example of a semiconductor device of a laminated structure using an interposer.
Figure 1B:
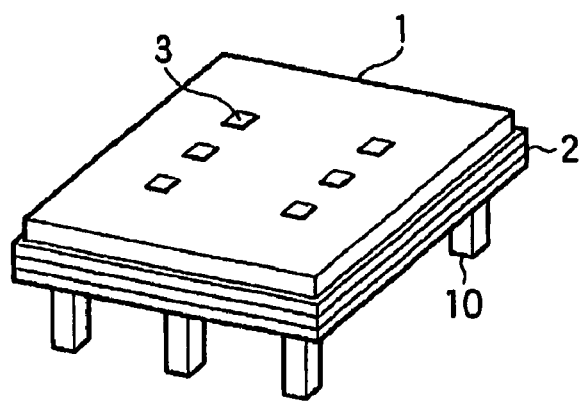

FIGS. 1a and 1b show an example of a semiconductor device of a laminated packaging structure using an interposer. The semiconductor device includes a semiconductor chip (first substrate) 1 formed of a semiconductor substrate having a device formed on its surface, and an interposer (wiring structure) 2 connected to the semiconductor chip 1.

The semiconductor chip 1 has a plurality of through-holes extending from signal output electrodes of the device to the interposer 2 through the semiconductor substrate. The semiconductor chip 1 has a plurality of connecting electrodes 3 which are formed by filling the through-holes with a metal.

The interposer 2 serves to convert an electrode position (pattern) of the semiconductor chip 1 into an electrode position for packaging. The interposer 2 has a connection layer 4, a conversion layer 5, and a lowermost layer 6. The connection layer 4 has electrodes 7 corresponding to the connecting electrodes 3 formed in the semiconductor chip 1. The conversion layer 5 has an electrode conversion pattern 8 that converts positions of the electrodes 7 of the connection layer 4. The lowermost layer 6 has electrodes for packaging 9 corresponding to electrode positions converted by the electrode conversion pattern 8 of the conversion layer 5. The electrodes 7, the electrode conversion pattern 8, and the electrodes for packaging 9 constitute signal output electrodes of the interposer 2. Projection electrodes 10 are respectively attached to the electrodes for packaging 9 of the lowermost layer 6.

An embodiment of a method of manufacturing a semiconductor device according to the present invention is described below with reference to FIGS. 2 to 5. In the present embodiment, a semiconductor device is manufactured that has a laminated packaging structure using the above-described interposer. A semiconductor device of a chip-level may be manufactured by using a semiconductor chip (first substrate) cut out from a semiconductor wafer, and an interposer (wiring structure) of a size corresponding thereto. However, in the following description, a semiconductor device of a wafer-level is manufactured by using a semiconductor wafer (first substrate) on which a device is formed, and an interposer (wiring structure) of a size corresponding thereto.

Figure 2:
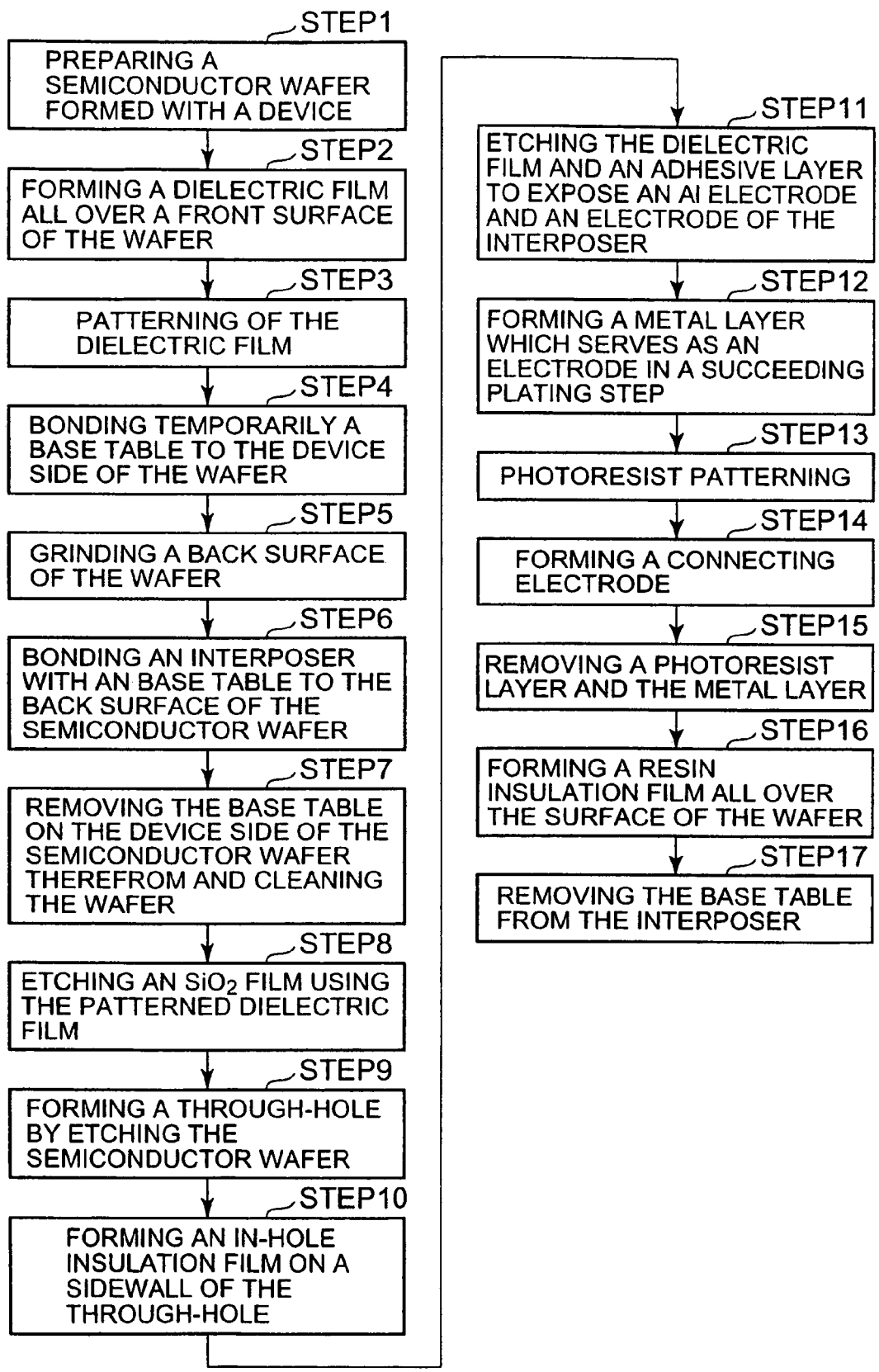
FIG. 2 is a flowchart illustrating a method of manufacturing a semiconductor device in one embodiment of the present invention.
Figure 3:
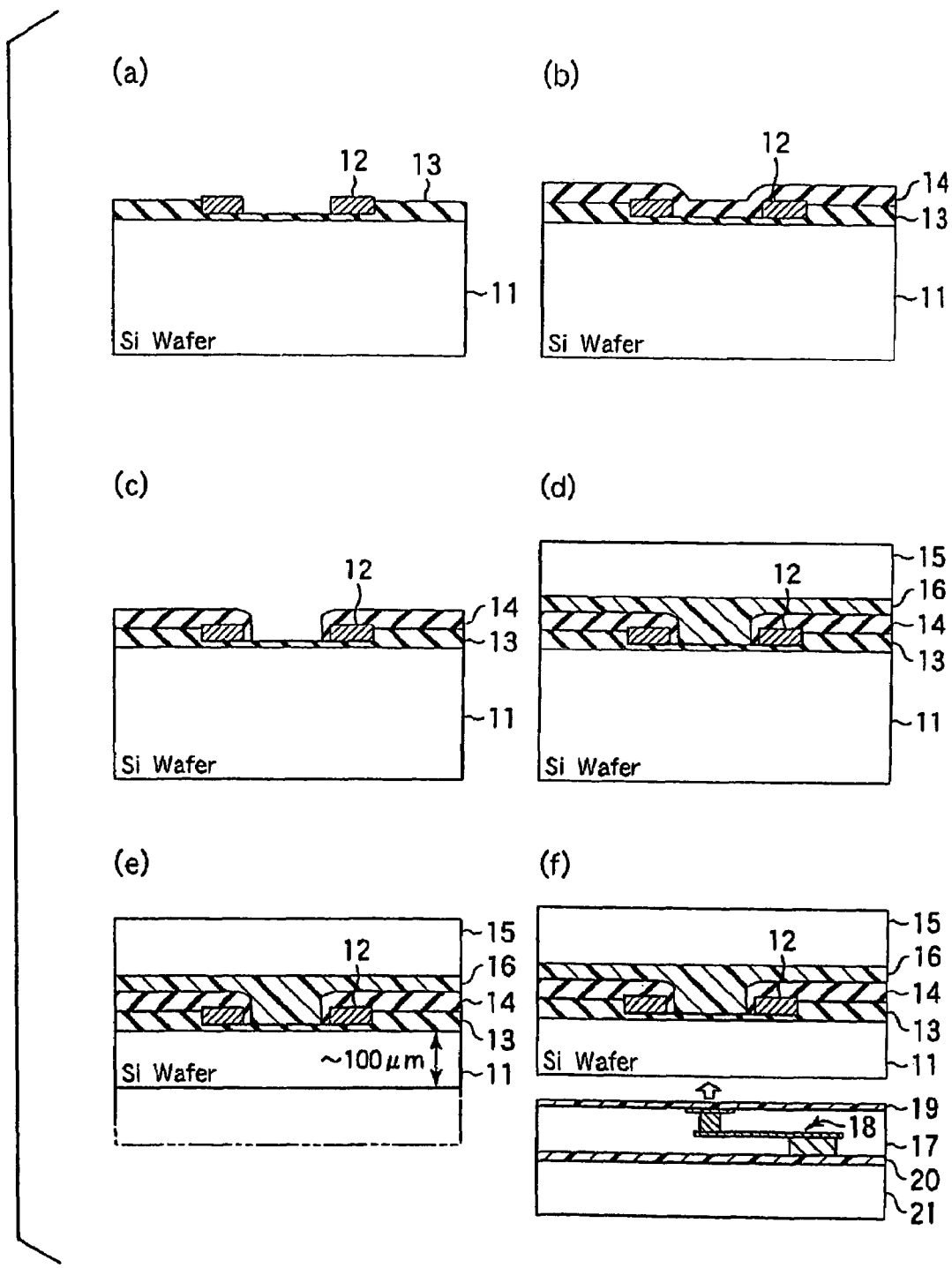
FIG. 3 is a cross-sectional view illustrating the manufacturing method shown in FIG. 2 in an order of steps (a) to (f)
Figure 4:
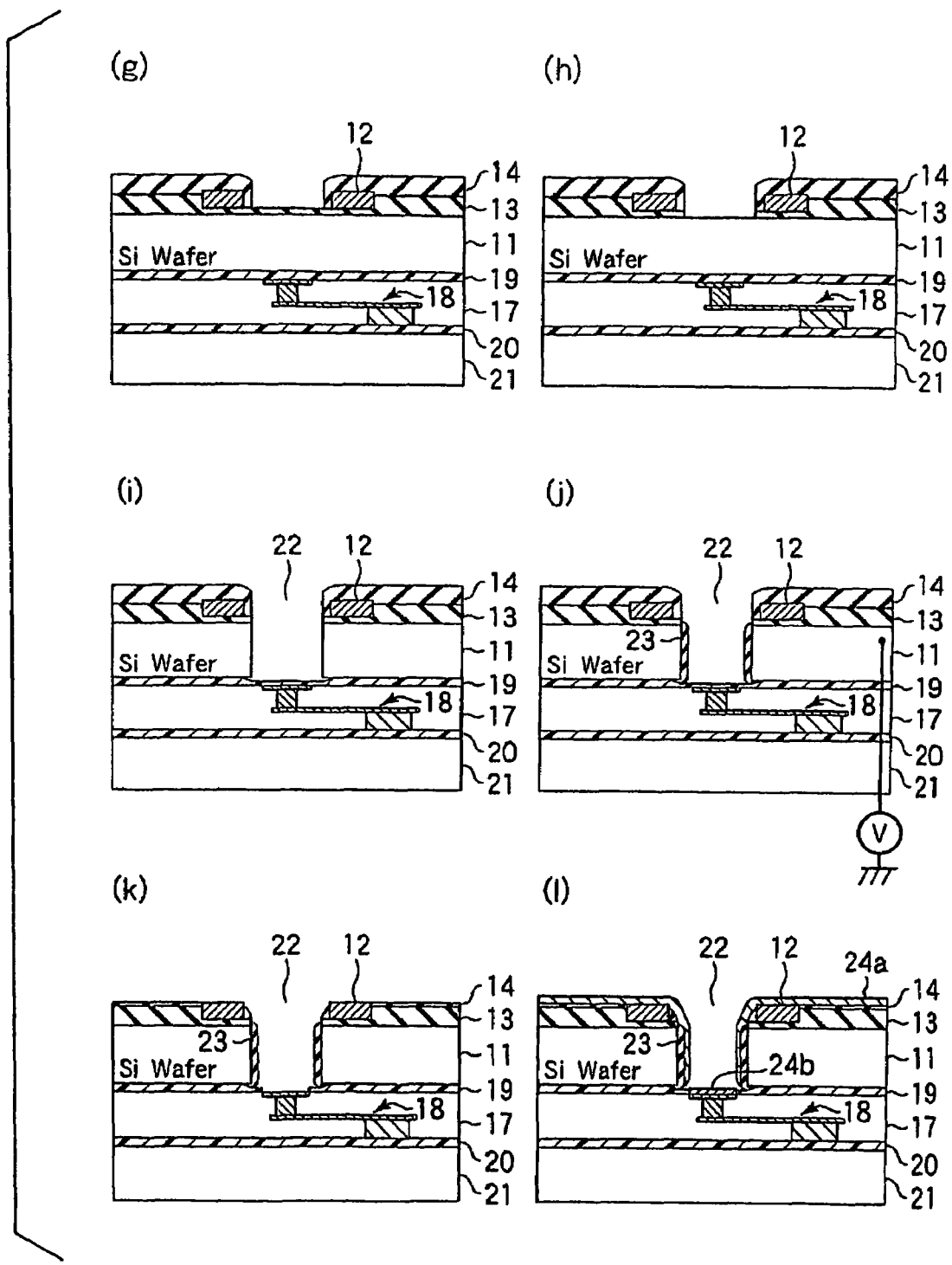
FIG. 4 is a cross-sectional view illustrating the manufacturing method shown in FIG. 2 in an order of steps (g) to (I)
Figure 5:
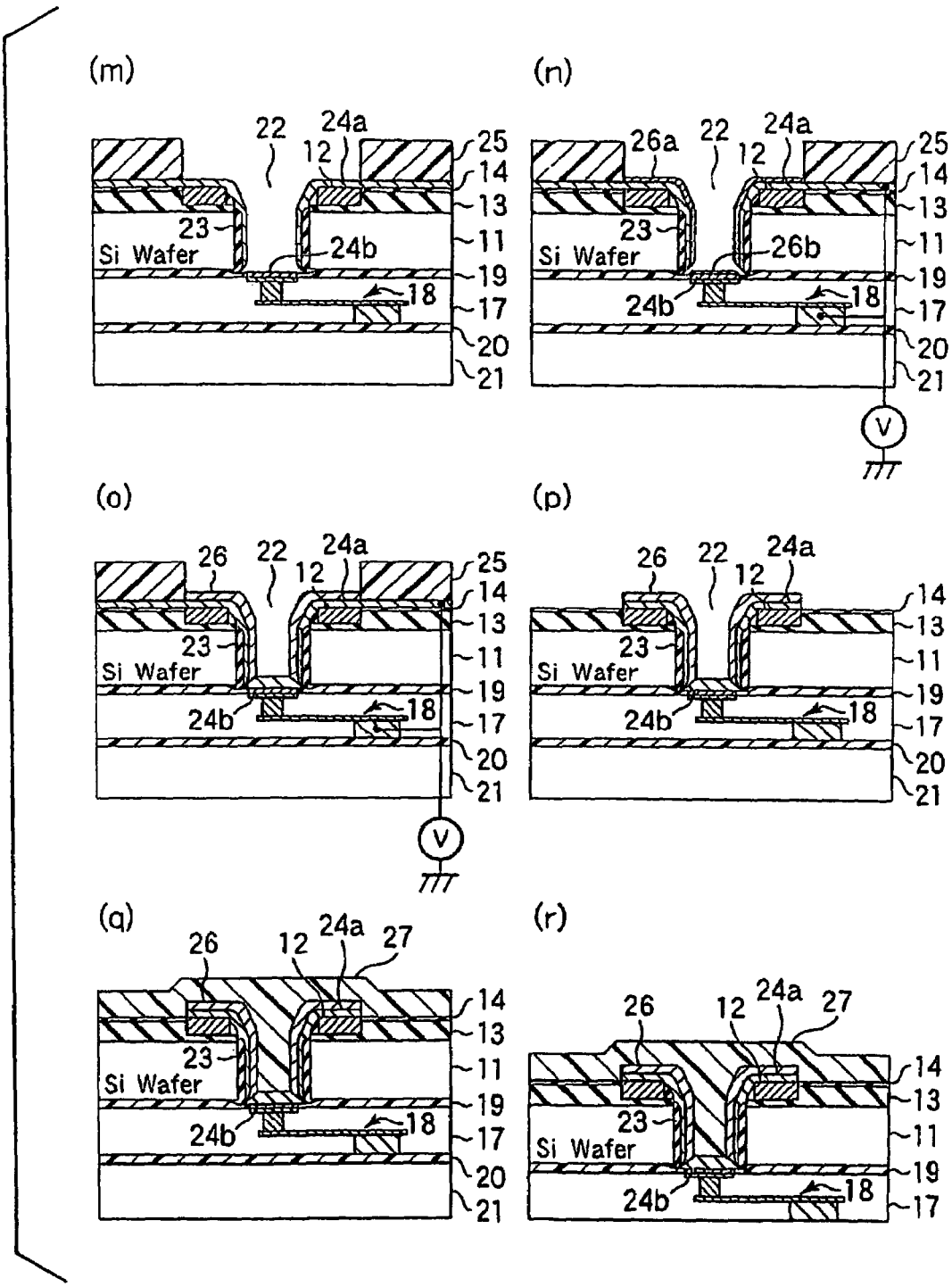
FIG. 5 is a cross-sectional view illustrating the manufacturing method shown in FIG. 2 in an order of steps (m) to (r)

In a step 1 of FIG. 2 (FIG. 3(a)), a semiconductor wafer 11 formed of, for example, silicon having a device on its front surface is prepared. The semiconductor wafer 11 has an Al (aluminum) electrode 12 for outputting a signal of the device. The Al electrode 12 is insulated by an $SiO_2$ layer 13 formed on the surface of the semiconductor wafer 11. An opening corresponding to a through-hole formed in an RIE etching step (step 9), which is described below, is previously formed on the Al electrode 12. In the cross-sectional views in FIGS. 3 to 6 and 8, only the electrode 12 for outputting a signal, which is relevant to the present embodiment, is shown, while an illustration of an overall structure of the device is omitted.

In a step 2 (FIG. 3(b)), a dielectric film 14 is formed over all the front surface of the semiconductor wafer 11. Materials and manufacturing methods of the dielectric film 14 are not specifically limited. For example, photosensitive application polyimide may be employed to form the dielectric film 14.

In a step 3 (FIG. 3(c)), the dielectric film 14 is patterned, and a part of the dielectric film 14 corresponding to a connecting electrode (hereinafter described) is removed. When photosensitive polyimide is used to form the dielectric film 14, a patterning of the dielectric film 14 can be carried out by means of a photolithographic art. In place of a dielectric film, a two-layered film having separate functions for insulating and patterning may be formed on the semiconductor wafer 11.

In a step 4 (FIG. 3(d)), a base table 15 is temporarily bonded to the device side (front surface side) of the semiconductor wafer 11 through an adhesive layer 16, taking a handling of the semiconductor wafer 11 in the following steps into consideration. Since the base table 15 is removed afterward, a layer that can be easily released by light or heat is used as the adhesive layer 16. A semiconductor wafer made of, e.g., silicon may be used as the base table 15.

In a step 5 (FIG. 3 (e)), a back surface of the semiconductor wafer 11 is grinded whereby a thickness thereof is reduced to be about 100 μm. Depending on the cases, a CMP polishing or a reactive ion etching (RIE) is carried out in order that grinding traces are removed.

In a step 6 (FIG. 3(f)), an interposer 17 is prepared. A base table 21 is temporarily bonded to a principal surface of the interposer 17 through an adhesive layer 20, the principal surface being opposite to a principal surface as an attachment surface of the interposer 17. An adhesive layer 19 serving as a dielectric film is formed on the attachment surface of the interposer 17 having the base table 21 bonded on the opposite principal surface. The attachment surface of the interposer 17 is bonded over all the back surface of the semiconductor wafer 11 through the adhesive layer 19.

The interposer 17 has basically the same structure as that of the interposer 2 shown in FIGS. 1a and 1b. The interposer 17 has a signal output electrode 18 formed of, e.g., Cu. The signal output electrode 18 corresponds to the electrodes 7, the electrode conversion pattern 8, and the electrodes for packaging 9 of the interposer 2 shown in FIG. 1a. The signal output electrode 18 has a function for converting an electrode position of the device into an electrode position for packaging. In the step 6 (FIG. 3(f)), the part removed from the dielectric film 14 by the patterning thereof. In the step 3 (FIG. 3(c)) is positioned such that the removed part corresponds to the signal output electrode 18 of the interposer 17.

The adhesive layer 19 is not removed afterward, but functions as a dielectric film. Thus, the adhesive layer 19 is made of a material whose adhesive force is increased by curing the same by heat or the like, after the adhesive layer 19 is bonded to the semiconductor wafer 11 and the interposer 17. On the other hand, the adhesive layer 20 is used to temporarily bond the base table 21, which is removed afterward, to the interposer 17. Thus, similar to the adhesive layer 16, the adhesive layer 21 is made of such a material that can be easily released by heat or light. A thickness of the adhesive layer 19 is in a range of from several μm to tens μm. When an insulation resistance of the adhesive layer 19 is insufficient, a dielectric film is additionally formed on the back surface of the semiconductor wafer 11.

The base table 21 is bonded to the interposer 17 for an easy handling of the same. However, when the interposer 17 has a sufficient thickness, the base table 21 can be omitted.

In a step 7 (FIG. 4(g)), the base table 15 which is temporarily bonded to the device side of the semiconductor wafer 11 is removed therefrom. Then, the semiconductor wafer 11 is cleaned to remove the adhesive layer 16. In order that only the adhesive layer 16 is selectively removed from the semiconductor wafer 11, the adhesive layers 16 and 20 are formed of different materials from each other.

In a step 8 (FIG. 4(h)), the $SiO_2$ layer 13 is etched using the dielectric film 14 as a mask, which is patterned such that the part corresponding to the signal output electrode 18 of the interposer 17 is removed.

In a step 9 (FIG. 4(i)), the semiconductor wafer 11 is RIE-etched by using the dielectric film. 14 and the $SiO_2$ layer 13 as a mask so as to form a through-hole 22 extending through up to the adhesive layer 19. A thickness of the dielectric film 14 is designed such that the Al electrode 12 is not exposed when the semiconductor wafer 11 is etched. At the time when the etching reaches the adhesive layer, the adhesive layer 19 is isotropic-etched, so that an undercut shown in FIG. 4(i) may be generated.

In a step 10 (FIG. 4(j)), an in-hole insulation film 23 is formed on a sidewall of the through-hole 22. The in-hole insulation film 23 is preferably made of electro-deposited polyimide. In order to form electro-deposited polyimide on the sidewall of the through-hole 22, voltage is applied to the semiconductor wafer 11, as shown in FIG. 4(j). When the in-hole insulation film 23 is formed of electro-deposited polyimide, a film is formed on a part where voltage is applied. Thus, a film can be securely formed over the part of the semiconductor wafer 11 which is exposed by the undercut of the adhesive layer 19. However, the in-hole insulation film 23 may naturally be made of other materials or by other methods, such as an $SiO_2$ film formed by CVD.

In a step 11 (FIG. 4(k)), the dielectric film 14 and the adhesive layer 19 exposed to a bottom of the through-hole 22 are etched by, for example, an RIE method, to thereby expose upper surfaces of the Al electrode 12 and the signal output electrode 18. After etching, the semiconductor wafer 11 may be cleaned according to need.

In a step 12 (FIG. 4(l)), metal layers 24a and 24b extending into the through-hole 22 is formed by, e.g., spattering. When an undercut is generated in the adhesive layer 19, there is a possibility that a metal layer is not formed thereon. In this case, as shown in FIG. 4(l), the metal layer 24a, which is formed on the dielectric film 14, the Al electrode 12, and the sidewall of the through-hole 22, is separated from the metal layer 24b, which is formed on the signal output electrode 18.

In a step 13 (FIG. 5(m)), a photoresist layer 25 is formed on a surface of the metal layer 24a at a part corresponding to the dielectric film 14. A pattern for connecting electrode is formed on the photoresist layer 25 by a photolithography.

In a step 14 (FIGS. 5(n) and 5(o)), a connecting electrode 26 is formed. Specifically, metal films 26a and 26b are formed on the metal layers 24a and 24b by plating using the photoresist layer 25 as a mask. The continuous metal films 26a and 26b constitute the connecting electrode 26. The connecting electrode 26 is formed of a material such as Cu. In order to form the connecting electrode 26 by plating, as shown in FIG. 5(n), voltage is first applied both to the metal layer 24a and the signal output electrode 18 of the interposer 17. Then, the metal films 26a and 26b are separated from the metal layers 24a and 24b. The metal films 26a and 26b grow to be connected with each other, as shown in FIG. 5(o), so that the connecting electrode 26 is formed. Thus, even when there is a part where a metal layer is not formed in the through-hole 22, the connecting electrode 26 can be securely formed. Needless to say, not limited to plating, the connecting electrode 26 may be formed by other methods such as CVD.

In a step 15 (FIG. 5(p)), the photoresist layer 25 and a part of the metal layer 24a under the photoresist layer 25 are removed. The photoresist layer 25 is removed by, e.g., ashing or wet-cleaning, while the metal layer 24a is removed by, e.g., etching.

In a step 16 (FIG. 5(q)), a resin insulation film 27 made of, for example, polyimide Is formed over all the device-side surface of the semiconductor wafer 11, with a view to Insulation and sealing. In a step 17 (FIG. 5(r)), the base table 21 bonded to the interposer 17 is removed.

According to the above steps 1 to 17, a semiconductor device, which has a structure shown in FIG. 5(r), of a laminated structure using an interposer can be obtained. The semiconductor device can be used as a laminated package by cutting at every device and attaching a packaging pad on a lower surface of the interposer 17.

In the semiconductor device provided by the above manufacturing method, substantially all the back surface of the semiconductor wafer 11 is bonded to the principal surface of the interposer 17. Therefore, a laminated structure can be formed without generating a gap caused by a soldered bump, resulting in a reduced thickness of the laminated structure in the laminating direction. Accordingly, the packaging size can be further reduced, and a heat dissipation of the device can be enhanced.

In the above manufacturing method, it may be considered that the interposer 17 is bonded to the semiconductor wafer 11 in which the through-hole 22 is previously formed, and the connecting electrode 26 is formed in the through-hole 22. However, a defective bonding (extrusion caused by an excessive adhesive, or deficient in adhesive) between the through-hole 22 and the signal output electrode 18 tends to occur. Thus, there is a fear of deteriorating a reliability of withstand voltage between the signal output electrode 18 of the interposer 17 and the semiconductor wafer 11. In view of the disadvantage, in the present embodiment, after the semiconductor wafer 11 and the interposer 17 are bonded to each other through the adhesive layer 19 serving as a dielectric film, the through-hole 22 is formed in the semiconductor wafer 11, and then the connecting electrode 26 is formed in the through-hole 22. In this way, a bonding between the signal output electrode 18 of the interposer 17 and the semiconductor wafer 11 is improved to enhance a reliability of a withstand voltage therebetween.

Figure 6:
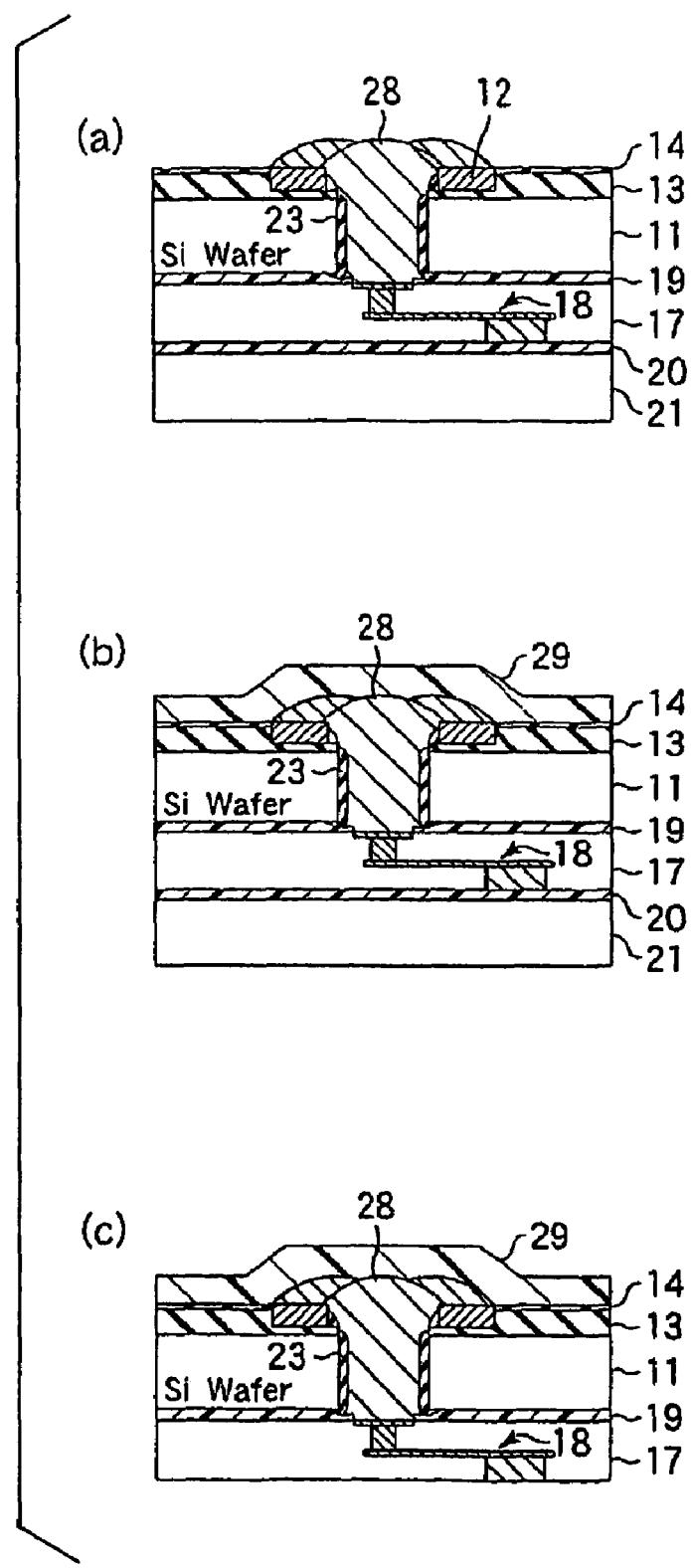
FIG. 6 is a cross-sectional view illustrating a part of a manufacturing method in another embodiment of the present invention in an order of steps (a) to (c)

Another embodiment of the present invention is described below referring mainly to FIG. 6.

In this embodiment, a connecting electrode is formed without using the metal layers 24a and 24b which are used in the above embodiment. To be specific, after the steps 1 to 11 of FIG. 2 (FIGS. 3(a) to 4(k)) are carried out similarly to the above embodiment, steps shown in FIGS. 6(a) to 6(c) are carried out In place of the steps 12 to 17 (FIGS. 4(l) to 5(q)) are carried out.

In a step of FIG. 6(a), voltage is applied to the electrode 12 of the device to plate the same, while voltage is applied to the signal output electrode 18 of the interposer 17. Then, metal such as Cu grows from the electrodes 18 and 12 to form a connecting electrode 28. In a step of FIG. 6(b), a resin insulation film 29 made of, e.g., polyimide is formed over all the device-side surface of the semiconductor wafer 11, with a view to insulation and sealing. In a step FIG. 6(c), the base table 21 bonded to the interposer 17 is removed therefrom.

A further embodiment of the present invention is described below referring mainly to FIGS. 7 and 8.

Figure 7:
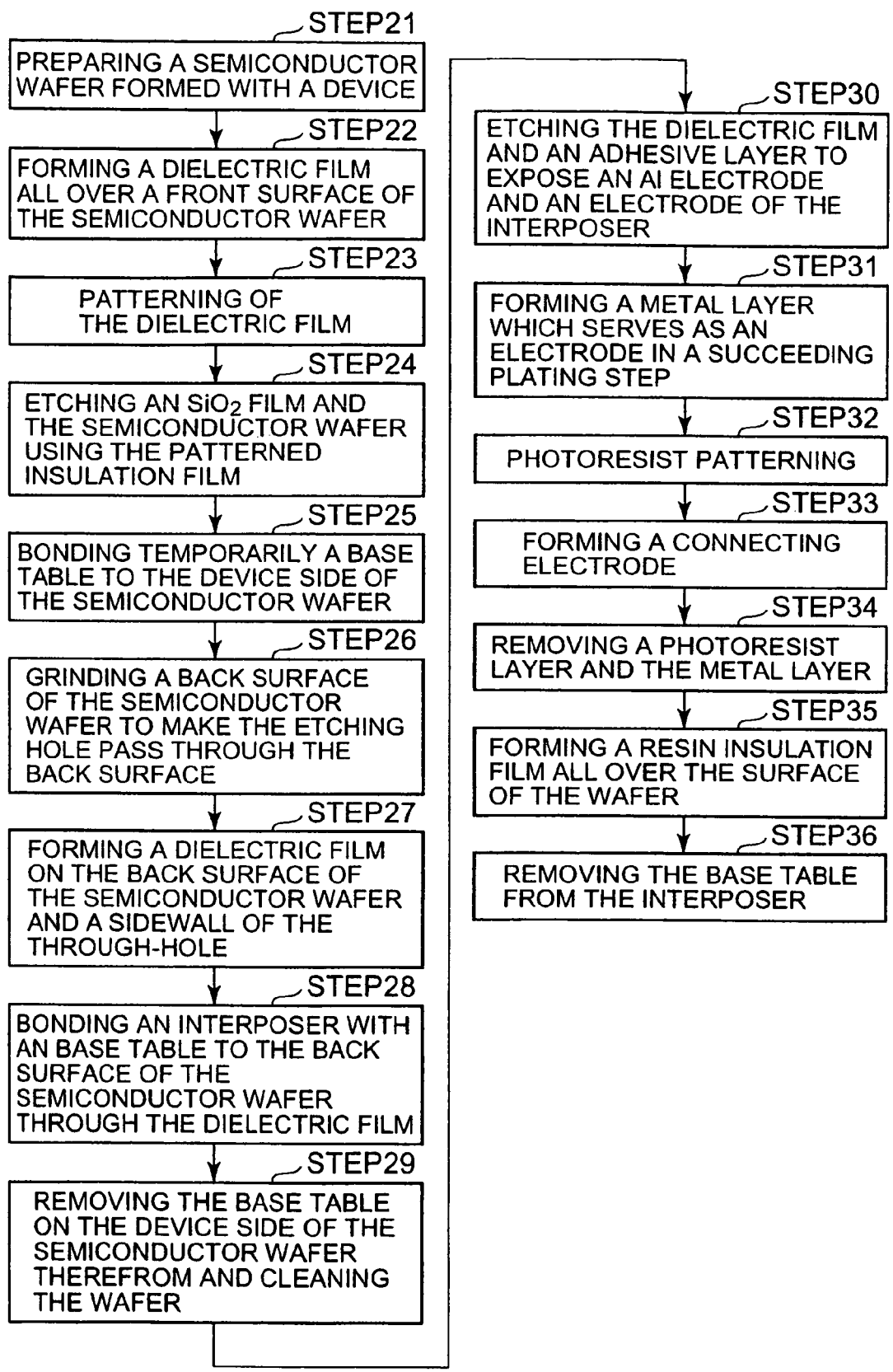
FIG. 7 is a flowchart illustrating a method of manufacturing a semiconductor device in a further embodiment of the present invention.
Figure 8:
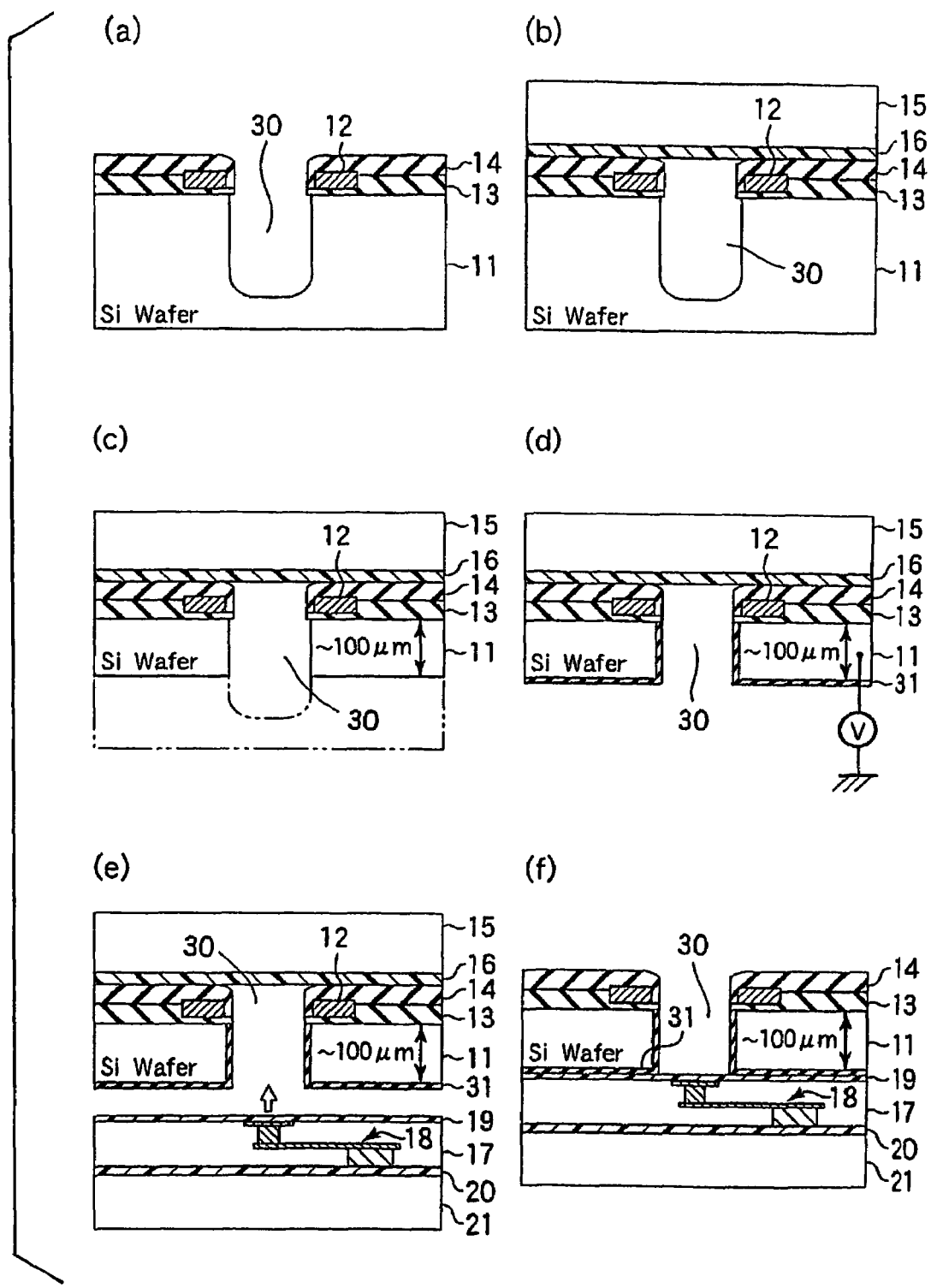
FIG. 8 is a cross-sectional view illustrating a part of the manufacturing method shown in FIG. 7 in an order of steps (a) to (f).

In this embodiment, steps 21 to 23 of FIG. 7 are the same as steps 1 to 3 of FIG. 2 (FIGS. 3(a) to 3(c)). The same structure as shown in FIG. 3(c) can be provided by these steps.

Thereafter, in a step 24 (FIG. 8(a)), the SiO$_2$ film 13 and the semiconductor wafer 11 are RIE-etched by using the dielectric film 14 which is patterned in the step 23 (FIG. 3(c)) as a mask. Then, an etching hole (blind hole) 30 is formed, which extends from the front surface of the semiconductor wafer 11 toward the back surface thereof, but does not pass through the back surface of the semiconductor wafer 11.

In a step 25 (FIG. 8(b)), the base table 15 is temporarily bonded to the device side of the semiconductor wafer 11 through the adhesive layer 16, taking a handling of the semiconductor wafer 11 in the following steps into consideration. Since the base table 15 is removed afterward, a layer that can be easily removed by light or heat is used as the adhesive layer 16. A semiconductor wafer made of silicon may be used as the base table 15. However, the base table 15 is preferably translucent, the reason of which is described hereafter.

In a step 26 (FIG. 8(c)), the back surface of the semiconductor wafer 11 is grinded whereby a thickness thereof is reduced to be about 100 μm. Thus, the etching hole 30 is formed to be a through-hole extending through the back surface of the semiconductor wafer 11. Depending on the cases, a CMP polishing or a reactive ion etching (RIE) is carried out in order that grinding traces are removed.

In a step 27 (FIG. 8(d)), a dielectric film 31 is formed on the back surface of the semiconductor wafer 11 and a sidewall of the etching hole 30. The dielectric film 31 is preferably made of electro-deposited polyimide. In order to form electro-deposited polyimide on the back surface of the semiconductor wafer 11 and the sidewall of the etching hole 30, voltage is applied to the semiconductor wafer 11, as shown in FIG. 8(d). The dielectric film 31 may naturally be made of other materials or by other methods, such as an SiO$_2$ film formed by CVD.

In a step 28 (FIG. 8(e)), the interposer 17 is prepared. The base table 21 is temporarily bonded to a principal surface of the interposer 17 through the adhesive layer 20, the principal surface being opposite to a principal surface as an attachment surface of the interposer 17. The adhesive layer 19 is formed on the attachment surface of the interposer 17 having the base table 21 bonded on the opposite principal surface. The attachment surface of the interposer 17 is bonded substantially (excluding the etching hole 30) over all the back surface, on which the dielectric film 30 is formed, of the semiconductor wafer 11 through the adhesive layer 19. The interposer 17 is positioned such that the signal output electrode 18 is situated correspondingly to the etching hole 30. If the base table 15 on the semiconductor wafer 11 has a translucency, the positioning can be easily carried out.

In this case, the adhesive layer 19 may be formed over all the attachment surface of the interposer 17. Alternatively, the adhesive layer 19 may not be formed on a part corresponding to the etching hole 30 by patterning. Then, it becomes unnecessary to remove the part of the adhesive layer 19 in a succeeding step 30. Also in this embodiment, since the base table 21 is bonded to the interposer 17 for an easy handling of the same, the base table 21 can be omitted when the interposer 17 has a sufficient thickness.

In a step 29 (FIG. 8(f)), the base table 15 which is temporarily bonded to the device side of the semiconductor wafer 11 is removed therefrom. Then, the semiconductor wafer 11 is cleaned to remove the adhesive layer 16. In order that only the adhesive layer 16 is selectively removed from the semiconductor wafer 11, the adhesive layers 16 and 20 are formed of different materials from each other.

Thereafter, steps 30 to 36 which are substantially the same as the steps 11 to 17 of FIG. 2 (FIGS. 4(k) to 5(r)) are sequentially carried out. In the step 30 of FIG. 7, similar to the step 11 of FIG. 2 (FIG. 4(k)), the dielectric film 14 and the adhesive layer 19 exposed to a bottom of the etching hole 30 are removed as a whole by a dry etching (RIE etching). However, when the adhesive layer 19 is previously patterned as described above, it is sufficient to remove only the dielectric film 14. In this case, it is possible to employ a wet etching.

In this embodiment, after the etching hole 30 as a through-hole is formed, the interposer 17 is bonded to the semiconductor wafer 11. It should be noted that after the dielectric film 31 is formed on the back surface of the semiconductor wafer 11 and the sidewall of the etching hole 30, the interposer 17 is bonded to the semiconductor wafer 11 through the dielectric film 31. Thus, different from the case in which the interposer 17 is directly bonded to the semiconductor wafer 11 after forming a through-hole, there generates no problem relating to a reliability of withstand voltage between the signal output electrode 18 of the interposer 17 and the semiconductor wafer 11. Further, the through-hole formed prior to the bonding of the inter pose 17 to the semiconductor wafer 11 can simplify the steps.

The present invention is not limited to the above embodiments, and various modifications and changes are possible.

For example, a semiconductor wafer is used as a first substrate in the above embodiments. However, not limited thereto, a chip cut out from a semiconductor wafer may be used as a substrate.

An interposer is used as a wiring structure in the above embodiments. However, not limited thereto, a semiconductor wafer or a semiconductor chip cut out from a semiconductor wafer as a second substrate formed with a second device may be used. In this case, it is also possible to form a so-called laminated chip having a predetermined number of laminated layers, by sequentially laminating layers on, for example, the wiring structure shown in FIG. 6(a) according to the manufacturing method described in the above embodiments.

A first substrate and a wiring structure are bonded to each other through an adhesive layer in the above embodiments. However, not limited thereto, the first substrate and the wiring structure may be bonded to each other by press bonding or diffusion bonding.

In addition, not limited to the flowcharts of the steps in the above embodiments, various steps can be employed without departing from the scope of the invention.

What is claimed is:

1. A semiconductor device comprising:
   a first substrate including a front surface and a back surface,
   a first device having a first electrode being formed on the front surface;
   a wiring structure formed with a second electrode, the wiring structure having a principal surface; and
   a connecting electrode extending through the first substrate from the front surface to the back surface thereof, and connecting the first electrode of the first device and the second electrode of the wiring structure, wherein
   substantially all the back surface of the first substrate is bonded to the principal surface of the wiring structure.

2. The semiconductor device according to claim 1, wherein a dielectric film is formed between the first substrate and the wiring structure.

3. The semiconductor device according to claim 2, wherein the dielectric film is an adhesive layer.

4. The semiconductor device according to claim 1, wherein the wiring structure is an interposer.

5. The semiconductor device according got claim 1, wherein the wiring structure is a second substrate formed with a second device having the second electrode.

6. The semiconductor device according to claim 1, wherein the first substrate is a semiconductor wafer.

7. The semiconductor device according to claim 1, wherein the first substrate is a semiconductor chip.

* * * * *